United States Patent [19]

Langley

[11] Patent Number: 5,818,368

[45] Date of Patent: Oct. 6, 1998

[54] METHOD AND APPARATUS FOR LOSSLESS DIGITAL DATA COMPRESSION

[75] Inventor: Robert E. Langley, Las Vegas, Nev.

[73] Assignee: Premier Research, LLC, Las Vegas, Nev.

[21] Appl. No.: 837,481

[22] Filed: Apr. 18, 1997

[51] Int. Cl.⁶ .................................................. H03M 7/42
[52] U.S. Cl. ............................................................ 341/106
[58] Field of Search ................................ 341/106, 67, 87, 341/51; 375/122; 348/415; 382/244

[56] References Cited

U.S. PATENT DOCUMENTS

| | | |
|---|---|---|
| 3,914,586 | 10/1975 | McIntosh . |
| 3,976,844 | 8/1976 | Betz . |
| 4,021,782 | 5/1977 | Hoerning . |
| 4,054,951 | 10/1977 | Jackson et al. . |
| 4,087,788 | 5/1978 | Johannesson . |
| 4,122,440 | 10/1978 | Langdon, Jr. et al. . |
| 4,286,256 | 8/1981 | Langdon, Jr. et al. . |
| 4,295,125 | 10/1981 | Langdon, Jr. et al. . |
| 4,366,551 | 12/1982 | Holtz . |
| 4,412,306 | 10/1983 | Moll . |
| 4,463,342 | 7/1984 | Langdon, Jr. et al. . |
| 4,464,650 | 8/1984 | Eastman et al. . |
| 4,467,317 | 8/1984 | Langdon, Jr. et al. . |
| 4,491,934 | 1/1985 | Heinz . |
| 4,494,108 | 1/1985 | Langdon, Jr. et al. . |
| 4,558,302 | 12/1985 | Welch . |
| 4,560,976 | 12/1985 | Finn . |
| 5,533,051 | 7/1996 | James . |

*Primary Examiner*—Brian K. Young
*Attorney, Agent, or Firm*—Finnegan, Henderson, Farabow, Garrett & Dunner

[57] ABSTRACT

A method and apparatus for lossless compression and decompression of digital data. Input data is processed by a binary search procedure to achieve nominal compression in a single iteration. Repeated iterations performed on the output of the first iteration provide significant compression of all types of digital data. The method may be practiced in software on a personal computer or implemented in VLSI hardware using a large number of identical compression circuits connected in series to achieve a systolic pipe architecture.

8 Claims, 7 Drawing Sheets

METHOD AND APPARATUS FOR LOSSLESS DIGITAL DATA COMPRESSION

BACKGROUND OF THE INVENTION

The present invention relates generally to digital data compression and, more particularly, to methods and apparatus for performing lossless digital data compression and decompression.

Many important industrial and commercial applications involve the use of information expressed in the form of digital data. As is well known, digital data, in contrast to analog data, is represented by a series of 1s and 0s (known as binary digits or "bits") formed into groups of "bytes" and "words." For example, both text and images can be expressed as groups of digital data for storage or transmission.

Some types of information constitute staggering quantities of digital data. For example, a detailed image such as an X ray of a brain tumor can easily require millions of bytes of digital data. To reduce storage and transmission costs of this data, methods have been developed for "compressing" digital data such that the original information is transformed into a new set of digital data having fewer numbers of bits. The compressed data can then undergo a reverse process of "decompression" to recover to the original information.

Two main types of digital data compression are known: "lossy" compression and "lossless" compression. Lossy data compression allows the decompressed data to differ from the original data so long as the decompressed data satisfies some fidelity criteria. For example, when images are transformed to digital data and then compressed, it may suffice to obtain an image from the decompressed data that appears to the human eye to be identical to the original image, even though varying degree of difference exists. As a result, lossy compression methods can be used only for certain types of data such as video and audio. The advantage of lossy compression is that higher degrees of compression may be obtainable than with lossless compression. The degree of compression is typically expressed as a ratio. For example, a compression method for which the original data is twice the size of the compressed data is said to have a 2:1 compression ratio.

In contrast to lossy data compression, lossless data compression provides data that, when compressed and subsequently decompressed, is exactly identical to the original data. A benefit of lossless compression is that it can be used with all types of information where full recovery of the original data is required.

Lossless data compression became well known in the early 1950s through the work of David Huffman, then at Bell Laboratories. Huffman's methods have formed the basis of virtually all work done in the area of lossless compression. In spite of more than forty years of work, however, current methods and apparatus for lossless data compression still only achieve average compression ratios of about 2:1. Although some types of highly repetitive data may be compressed to a degree somewhat greater than this, the average is still generally about 2:1.

Many known prior art techniques for lossless compression of text data depend upon knowing in advance (or determining "on the fly") the probable frequency of occurrence of alphabet symbols in the original data. For example, in the case of English text, current lossless methods often depend upon the knowledge that the letters E and N occur more often than the letters Q and Z. This information is then used to develop a coding structure that assigns shorter codes to those symbols occurring more often and longer codes occurring less often. Although known methods are useful in many applications, it is desirable to provide methods and apparatus for lossless digital data compression that achieve higher compression ratios than the prior art and that do not require advance information about the content of the source data.

The present invention is directed to lossless digital compression/decompression methods and apparatus in which all data encoded can be recovered byte-by-byte with no loss of the original information. The present invention provides methods and apparatus for lossless compression in which very large compression ratios are achieved.

SUMMARY OF THE INVENTION

The advantages and purpose of this invention will be set forth in part in the description that follows, and in part will be obvious from the description, or may be learned by practice of the invention. The advantages and purpose of the invention will be realized and obtained by means of the elements and combinations particularly pointed out in the appended claims.

To obtain the advantages and in accordance with the purpose of the invention, as embodied and broadly described herein, the present invention provides methods and apparatus for lossless digital data compression. Specifically, the present invention, in a first aspect, comprises a method for compressing digital data. The method includes the steps of receiving digital data to be compressed, separating the digital data into groups having predetermined sequences of ones and zeros, processing a sequence according to a predetermined procedure to obtain a compressed sequence value of variable length by removing bits, and storing the compressed sequence value in a temporary storage area. The method comprises the further steps of generating a removal code representative of the number of bits removed, generating a separator code according to predetermined criteria, storing the removal code and separator code in a predetermined relationship with the compressed sequence value in the temporary storage area, and performing the preceding steps for each of the sequences to obtain an intermediate data set. The method further includes separating the intermediate data set into sequences and repeatedly performing the preceding steps a plurality of iterations according to predetermined criteria. The final step is supplying the intermediate data set of the final iteration as a compressed version of the received digital data.

In another aspect, the present invention comprises apparatus for lossless digital data compression comprising an input terminal receiving digital data to be compressed, an output terminal supplying compressed digital data, and first, second, and third compression circuits. Each of the compression circuits comprises an input circuit for received input data, a processor circuit separating the received input data into sequences according to predetermined criteria, a binary search processor for processing the sequences using a binary search procedure to obtain compressed sequence values corresponding to the sequences with lower order bits removed, a code generator for generating removal codes representative of the number of bits removed and separator codes according to the characteristics of the compressed sequence values and removal codes, and an output circuit for supplying the compressed sequence values, removal codes, and separator codes as output data. The input circuit of the first compression circuit is connected to the input terminal, the output circuit of the first compression circuit is connected to the input circuit of the second compression circuit, the output circuit of the second compression circuit is coupled to the input circuit of the third compression circuit, and the output circuit of the third compression circuit is connected to the output terminal.

BRIEF DESCRIPTION OF THE DRAWINGS

The accompanying drawings, which are incorporated in and constitute a part of this specification, illustrate embodiments of the invention and together with the description served to explain the principles of the present invention.

DESCRIPTION OF THE PREFERRED EMBODIMENTS

Figure 1:
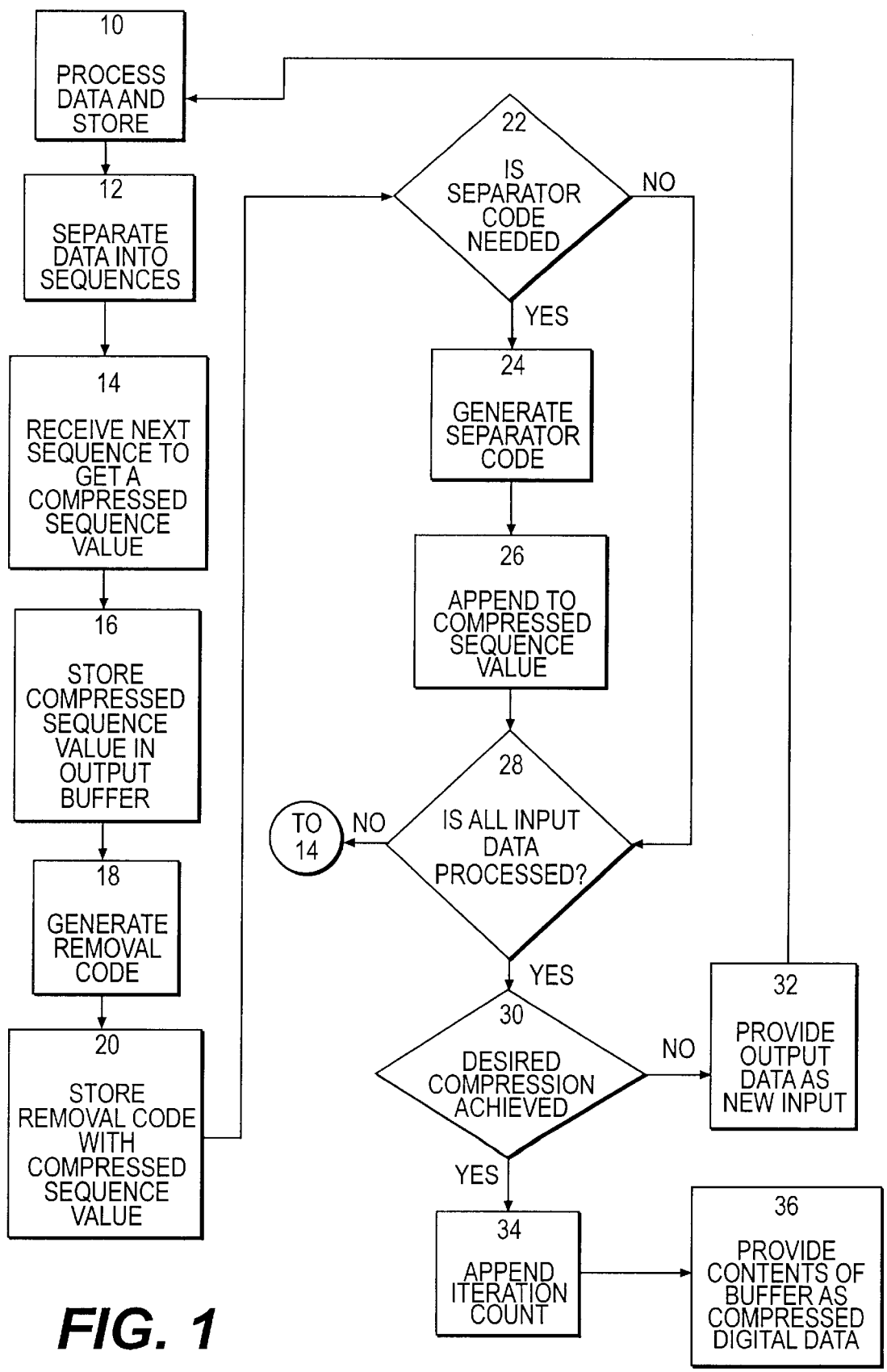
FIG. 1 is a logic flow chart of a method for lossless compressing of digital data.

The present invention employs iterative techniques in which a search procedure is used to achieve a nominal compression ratio on one pass and to achieve a much greater compression after a series of passes, or iterations. In the preferred embodiment, a binary search procedure is employed. Using this procedure, all eight-bit integers, for example, can be compressed to seven bits or less in a simple iteration. In particular, all odd integers are compressed to seven bits and all even integers are compressed to six bits or less. The average compression achieved for all eight-bit integers taken together is two bits per integer, yielding an average compressed code length of six bits for an original eight-bit integer after a single iteration. This corresponds to a gross compression of 25 percent per integer. The word "gross" is used because some of this compression is used up by overhead so that the net compression per integer per iteration is significantly less. However, the present invention employs successive iterations to ultimately achieve very significant compression ratios.

The well-known technique of a binary search will now be briefly described, with respect to eight-bit integers. First, the numerical midpoint for all eight-bit integers is selected. Since the largest integer that can be accommodated in eight-bits is 255, the midpoint is 128, or $2^7$. Next, it is determined if the input integer value presently being encoded is greater or less than the midpoint 128. If the input value is less than the midpoint, a 0 is provided as output. If the input value is greater than the midpoint, a 1-bit is provided as output. If the input value is equal to the midpoint, the process terminates without outputting a bit.

The next step is to select the next lower power of 2, which in this case is $2^6$, or 64. This value is added to the previous midpoint if the input value was higher than the previous midpoint or it is subtracted from the previous midpoint if the input value was lower. This step yields either 192 or 64. The input value is then compared to this new midpoint and, once again, if the input value is lower than this midpoint, a 0 is output and if it is higher than this midpoint a 1-bit is output. If the input value is equal to the midpoint, the process terminates. While proceeding in this manner, the number of output bits being produced is retained. The above-described process continues until the current value being encoded is correctly located. This process yields an output bit stream, known as a binary search code, of the length indicated above (i.e., seven bits if the input value is odd, and six bits or less if the input value is even). Therefore, the compressed output for successive input values consists of a series of binary search codes comprising bit sequences of various lengths.

To decompress the compressed output of the binary search, it is necessary that the decompression method be able to determine the length of the next bit sequence constituting the binary search code that it is to decode. Therefore, the preferred embodiment of the present invention provides additional codes, called "removal codes" and "separator codes" associated with the binary search codes. It is these additional codes that constitute the overhead referred to above.

In a preferred embodiment, the present invention separates input data into "sequences." A sequence is defined as a string of bits starting with one or more one-bits and ending with one or more zero-bits (i.e., prior to the next one-bit)

For example, assume the following string of bits was received as input:

101101001100

This string would yield four "sequences," in order, as follows:

| | | |
|---|---|---|
| Sequence #1 | = | 10 |
| Sequence #2 | = | 110 |
| Sequence #3 | = | 100 |
| Sequence #4 | = | 1100 |

For random numbers, the average sequence length is four (4) bits. The most important characteristic of sequences defined in this manner is that they all end with zero. The value of this will be apparent in the process of compressing the sequences, described below, which yields a net compression sufficient to make the preferred embodiment of present invention a viable process, given its iterative nature. That is, a relatively small amount of compression achieved at each iteration, or cycle, accumulates over the course of many cycles to yield the extremely large compression ratios that are characteristic of the present invention.

In the preferred embodiment of the present invention, each sequence is processed by the binary search technique to generate a compressed sequence value, that is, a code consisting of the input sequence with certain bits removed, specifically, the low-order (i.e., right-most) zero bits, up to and including the first low-order one-bit. The preferred embodiment precedes each compressed sequence value with a removal code indicative of the number of bits which were removed from the original sequence by the binary search technique. The removal codes are shown in Table I, below.

TABLE I

| Number of Bits Removed | Actual Bits Removed | Removal Code |
|---|---|---|
| 2 | 10 | 0 |
| 3 | 100 | 10 |

TABLE I-continued

| Number of Bits Removed | Actual Bits Removed | Removal Code |
|---|---|---|
| 4 | 1000 | 110 |
| 5 | 10000 | 1110 |
| etc. | | |

It will be noted that in all cases the removal code is one bit less than the number of bits removed. This explains the fact that, including the removal code, compressed sequences realize one bit of compression.

Compressed sequence values come in four (4) types (designated as "classes") based on their characteristics. Examples of the four classes of compressed sequences are set forth in Table II, followed by a discussion of each.

TABLE II

| Source Bit Sequence | Compressed Sequence* | Class Code |
|---|---|---|
| 110 | (0)1 | H |
| 100 | (10) | R |
| 1100 | (10)1 | B |
| 10 | (0) | N |

*Removal codes are shown in parentheses to distinguish them from other bits in the compressed sequence.

Class Code H

The two low-order bits "10" are removed and replaced with removal code "0" (see previous section). Note that removing the two low-order bits leaves a one-bit which is shown following the removal code in the compressed sequence. This bit is designated a "hanging bit" since it is left hanging. This describes a class of compressed sequences denoted as class H—namely those with hanging bits.

Class Code R

The three low-order bits in the source sequence "100" are removed and replaced with removal code "10." This compressed sequence has no hanging bits. However, it does have a high-order one-bit in the removal code. This feature characterizes this class (i.e., removal code one-bit) and explains the class code "R".

Class Code B

The three low-order bits in the source bit sequence "100" are removed and replaced with removal code "10". This time there is a hanging bit and a removal code one-bit. Since it has both, the class code is "B".

Class Code N

Removing the "10" results in a removal code "0" and leaves no hanging bits. Since this compressed sequence has neither hanging bits nor removal code one-bits, its class code is "N".

The above examples describe all types of compressed sequences that can occur. Obviously, class H can have more than one hanging bit, and class R can have more than one removal one-bit. Class B can have multiples of each. However, this does not alter the class designation.

If the four compressed sequences given in the preceding section are strung together as a compressed bit stream, they would appear as follows, again with removal codes indicated in parentheses:

(0)1(10) (10)1(0)

When this compressed stream is decompressed, there are, of course, no parentheses to help. Moving from left to right, it is clear that the first zero bit constitutes a removal code of zero, since the first information appearing in data compressed according to the present invention must be is a removal code. However, the next one-bit could be either a hanging bit or a removal code one-bit. This is typical of the fact that in many cases adjacent compressed sequences "bleed" together at their boundary. To resolve this situation, the preferred embodiment of the invention employs a final type of overhead called a "separator" code.

Separator codes are applied according to the following rules:

when hanging bits are present (i.e., one or more one-bits immediately following the removal code), insert a separator zero bit after the last hanging one-bit.

when no hanging bits are present and the removal code has one or more high-order one-bits, insert a separator zero bit immediately before the start of the next removal code.

The revised compressed code stream, with separator codes underlined, now appears as follows:

(0)1 0(10)0(10)1 0(0)

The addition of a separator bit to a compressed code sequence loses the compression for that sequence but does not cause expansion. Since 75% of the sequences require a separator bit, net compression comes from the 25% that do not require a separator code.

An example of this technique will now be described. Consider the following random 32-bit source input bit stream:
10100101100110100011100011101010(=32 bits)

TABLE III

| | Source Sequences | Compressed Sequences (with Removal Codes) | Class Code |
|---|---|---|---|
| 1. | 10 | (0) | N |
| 2. | 100 | (10) | R |
| 3. | 10 | (0) | N |
| 4. | 1100 | (10)1 | B |
| 5. | 110 | (0)1 | H |
| 6. | 1000 | (110) | R |
| 7. | 111000 | (110)11 | B |
| 8. | 1110 | (0)11 | H |
| 9. | 10 | (0) | N |
| 10. | 10 | (0) | N |

By processing this input bit stream in the manner described above, the input is first separated into sequences as shown in the left hand column of Table III above. The sequences are then compressed with the binary search technique to obtain the compressed sequence values shown in the middle column of Table III, with removal codes indicated in parentheses. The class code for each of these sequences is then shown in the right hand column of Table III.

The compressed sequence values of the middle column of Table 3 are then analyzed according to the two rules described above to generate separator codes. Application of these rules and the addition of the separator codes results in the following compressed sequence bit stream:

(0)0(10)(0)0(10)10(0)10(110)0(110)110(0)110(0)(0) (=29 bits 9.375% Compression)

Again, removal codes are indicated in parentheses. Separator codes are underlined. It can be seen that application of the technique described above results in a compressed bit stream of 29 bits, from the original input bit stream of 32 bits. This represents a compression of 9.35% for this particular example.

Hence,

25% compression (with removal codes)

× 25 of all sequences 6.25% net compression per cycle

One embodiment of the invention is implemented in a VLSI chip using an architecture known as a "systolic pipe." In this design, identical circuits are connected in series in a sequential chain constituting a systolic pipe processor. Input data enters the first circuit in the pipeline. As compressed output data is produced from the first circuit (corresponding to a first "cycle"), it is received by the second circuit in the sequential chain. This process continues down the entire chain until output bits constituting compressed data are supplied by the final circuit in the sequence.

The effect of this is to overlap much of the processing time. That is, while new data is entering the first circuit, data that has entered previously is being simultaneously processed by other circuits downstream in the chain. The delay exhibited by the system, known as "latency" time, is that time that elapses between when data first enters the top of the pipe, that is, the input circuit, and the time when output is first produced from the bottom, the last circuit in the sequence. At the speeds of current semiconductor devices, this total latency time can be very small indeed, even for a very lengthy pipe. The present invention can keep up with even the most demanding real-time applications having very high bit rates.

The length of the pipe, that is the number of sequential circuits in the chain, determines the amount of compression that will be produced by the total pipeline. Therefore, different chips each incorporating different degrees of compression can be produced to provide hardware appropriate for specific applications.

Referring now to FIG. 1, a logic flowchart is shown of a method constituting a first embodiment of the present invention. In a first step 10, the method receives digital data to be compressed and stores it into an input buffer. At step 12, the method separates the data into sequences.

Next, at step 14, the stored data is processed according to a predetermined procedure to obtain a compressed data value of variable length. In the preferred embodiment, a binary search procedure is employed, as described above. The compressed data value is stored at step 16 into a temporary storage area and, at step 18, the method generates a removal code representative of the number of bits removed from the sequence in the compression step. The removal code is then stored in a predetermined relationship with the compressed word value in the temporary storage area, at step 20.

At step 22, a determination is made of whether a separator code is required. If so, a separator code is generated at step 24 according to a predetermined set of rules and appended to the compressed sequence value in step 26. In the preferred embodiment, the separator code is generated according to the rules set forth above.

At step 28, a determination is made of whether all data of the input buffer have been processed. If so, the data stored in the temporary storage area constitutes an intermediary data set, and the method advances to step 30. If all input data words have not been processed, the method returns to step 14 and performs steps 14–22 for each of the input data bytes stored in the input buffer. At step 30, the method determines whether the desired degree of data compression has been achieved, according to a predetermined criteria. In the preferred embodiment, the predetermined criteria constitutes a time limit. Other criteria may be employed, such as, for example, a predetermined number of iterations, a predetermined desired compression ratio, or other equivalent criteria.

If the desired degree of data compression has not been achieved, the method advances to step 32, and the intermediate data set is stored in the input buffer. The method returns to step 12, and the data of the input buffer is separated into sequences. The method then performs steps 14 through 28 until all data of the input buffer have been processed and then advances to step 30 where, once again, a determination is made as to whether the desired degree of data compression has been achieved. If the desired degree of compression has been achieved, an iteration count, representing the number of compression loops executed, is appended at step 34 to the intermediate data set stored in the temporary storage area. This data is provided at step 36 as output of the encoder and constitutes a compressed version of the digital data received at step 10.

Figure 2:
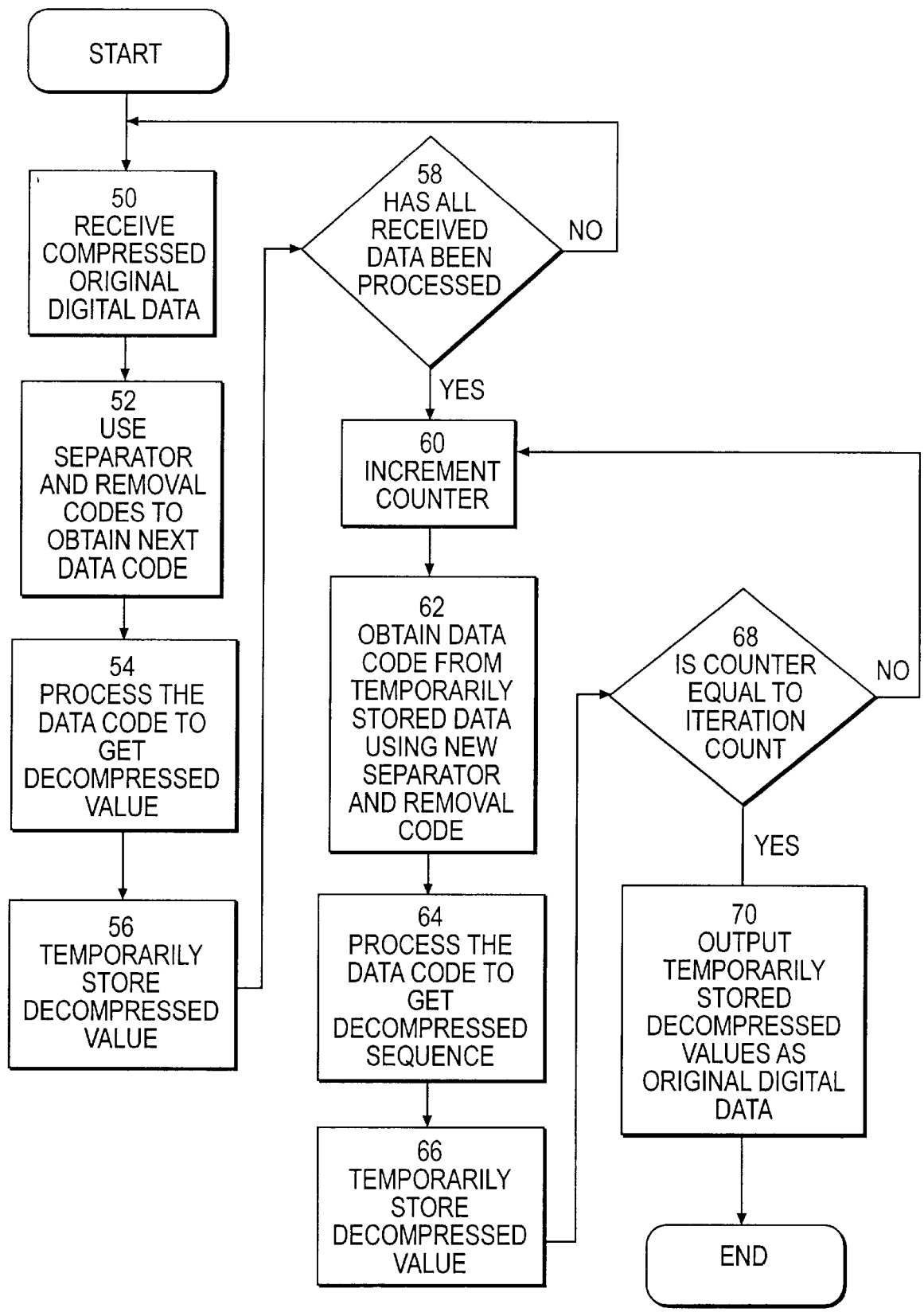
FIG. 2 is a logic flowchart of a method for decompressing compressed original digital data.

Referring now to FIG. 2, a logic flowchart is shown of a method for decompressing compressed original digital data that constitutes a first embodiment of another aspect of the invention. As shown in FIG. 2, the method begins at step 50 by receiving compressed original digital data of the type generated by the method illustrated in FIG. 1. This received data includes compressed data codes of various lengths, including removal codes and separated by separator values and further includes an iteration count. At step 52, the method uses the separator values to obtain the next data code from the received data. The method for identifying separator codes is described in more detail below. The next compressed sequence value is then processed at step 54 to obtain a decompressed value. In the preferred embodiment, this processing is based upon the binary search technique, using the removal code and one-bits to obtain a decompressed sequence. At step 56, the method temporarily stores the decompressed sequence. A determination is made at step 58 of whether all input data has been processed. If not, the method loops back and repeats steps 52 through 56. If all data has been processed, the method proceeds to step 60 where a counter is incremented.

Next, the method obtains a data code at step 62 from the temporarily stored decompressed values, recognizing a separator from the temporarily stored data in the manner to be described below.

The method then processes the data code at step 64 to get a decompressed sequence. At step 66, the method temporarily stores the decompressed sequence and determines at step 68 whether the value of the counter is equal to the iteration count. If not, the method loops back and repeats steps 60, 62, 64, and 66. If the counter value equals the iteration count, then decompression is complete. The method then supplies as output the temporarily stored decompressed values. This output data constitutes the original digital data.

Figure 3:
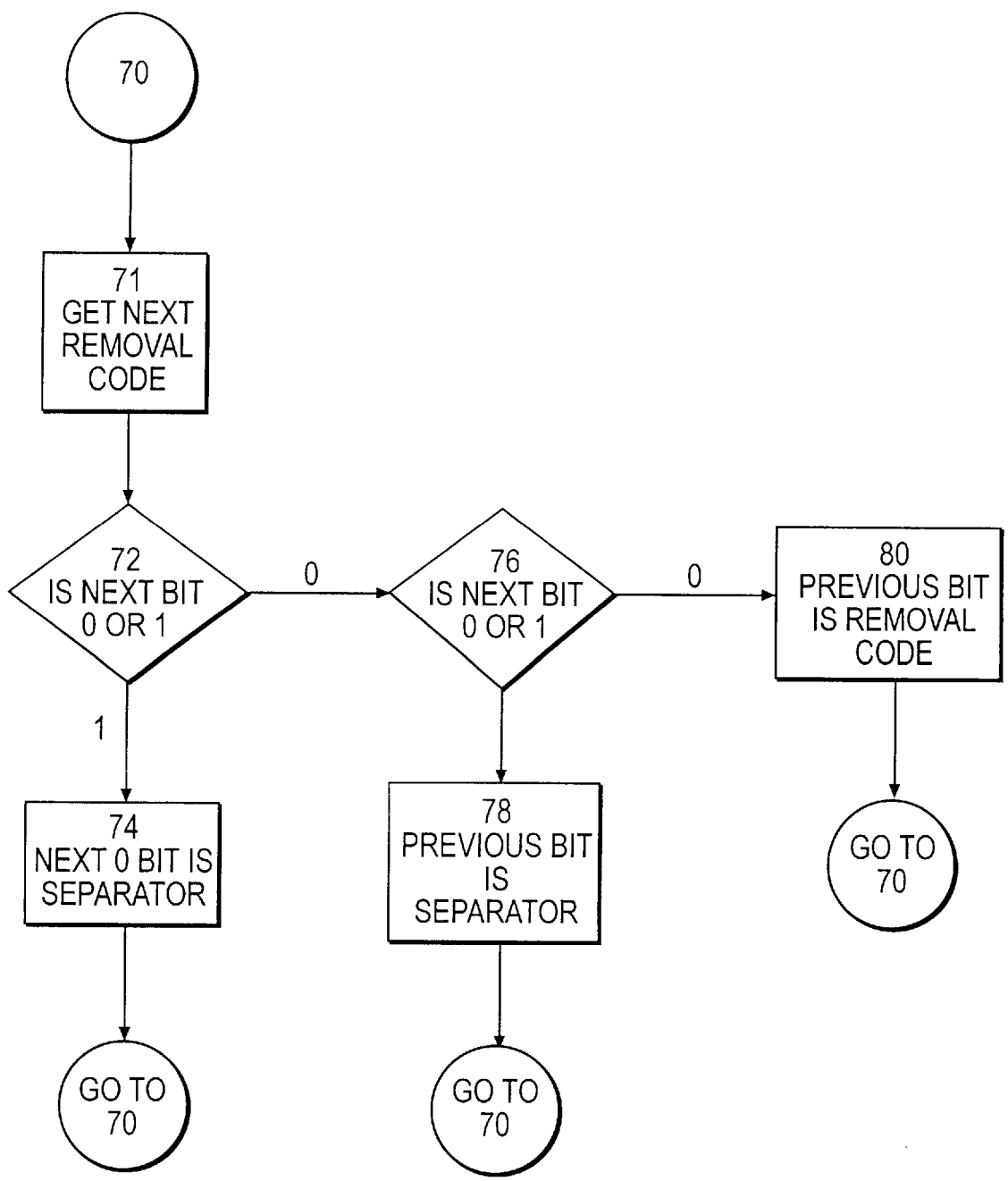
FIG. 3 is a logic flowchart of a method for identifying separator codes in the method of FIG. 2.

Referring now to FIG. 3, a logic flowchart is shown of a method for identifying separator codes while decompressing the compressed input data. The method begins at step 70. As shown in step 71, the next removal code in the bit stream is identified. This consists of identifying the highest order 0 bit in the bit stream. All high order bits up to and including this 0 constitute the removal code. Next, in step 72 a determination is made of whether the next bit after the removal code is a 0 or a 1. If it is a 1, this bit and all successive 1 bits constitute hanging bits associated with the previous removal code. The next successive 0 bit thus is unambiguously identified as a separator code, as indicated at step 74. The method then loops back to step 70.

On the other hand, if the determination at step 72 is that the next bit is a 0 bit, such 0 bit could either be a separator code or a removal code. This ambiguity is resolved at step 76 by determining if the next bit (the second bit after the removal code identified in step 70) is a 1 or a 0. If this bit is a 1, the previous bit (the first bit after the removal code identified in step 70) is unambiguously identified as a separator code at step 78, and the program loops back to step 70.

On the other hand, if step 76 determines that the second bit after the removal code identified in step 71 is a 0, then step 80 identifies the zero bit from step 72 as a removal code. In this manner, separator bits can be unambiguously identified in the compressed bit stream, thereby facilitating the method of FIG. 1.

Figure 4:
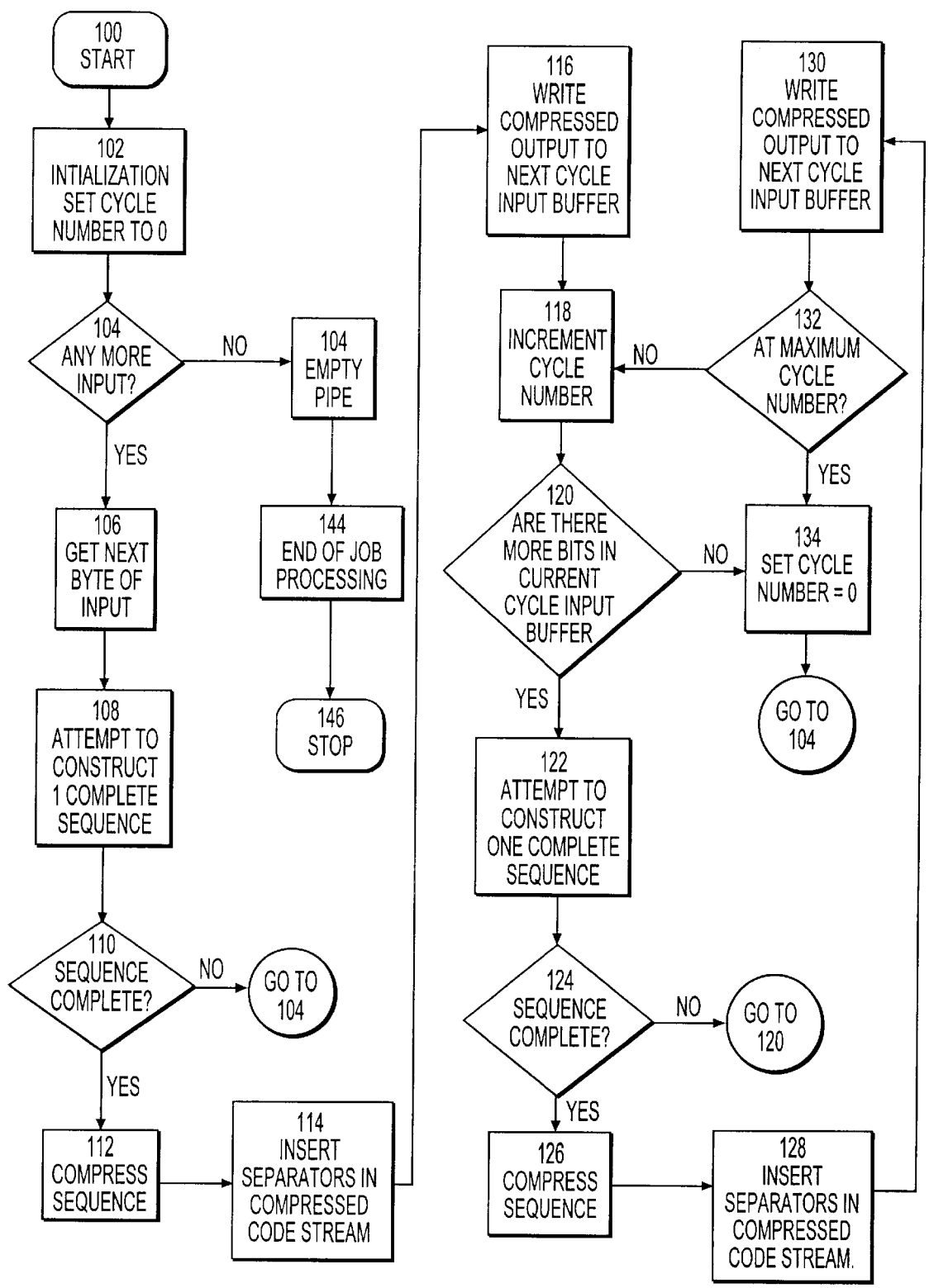
FIG. 4 is a logic flowchart of a method for lossless compressing of digital data which constitutes another embodiment of the present invention.

FIG. 4 shows a more detailed logic flowchart of a method for compressing data that constitutes a second embodiment of one aspect of the present invention, implemented as an application program on a programmable digital computer. In operation, the program fills a plurality of cycle buffers, each corresponding to an additional degree of compression. A determination is made by a user as to the degree of compression that will be required, thereby determining the number of cycles that the program will execute. During operation, a first time period consists of reading in input data and filling all of the buffers of the program. This can be thought of conceptually as "filling the pipe." During this period, the program is accepting input data but produces no output.

After all the buffers are filled, the program continues to receive input data and also produces compressed data as output. This second period continues until all input data are exhausted.

When all input data are exhausted, and there are no additional input data to be compressed, the program continues to produce compressed data as output, as it empties the buffers that were filled during the first time period. This third period can be thought of conceptually as "emptying the pipe." A more detailed explanation of this embodiment will now be provided.

At step 100, the program begins execution. Initialization is performed at step 102, during which the program communicates with the user to determine specifications for the current run. This includes such information as the name of the file to be compressed, the name of the output file where the compressed data will be stored, and the maximum number of cycles to be executed, that is, the desired level of compression to be achieved. The program then proceeds to open the files specified by the user for input and output and store the desired input data in the zero-cycle input buffer. The cycle number is initially set to zero.

The program checks at step 104 to see if there are additional bytes of input to be compressed, as stored in the zero-cycle input buffer. If so, the program proceeds to step 106 to obtain this input and form it into a sequence at step 108. If insufficient input is left to form a sequence, step 110, the program loops back to step 104.

At step 112, the sequence is compressed by removing low-order zero-bits and the first low-order one-bit and adding a removal code. At step 114, a separator code is added, if necessary.

At step 116, the compressed sequence code, its removal code, and separator code are stored in the input buffer for the next cycle. A "cycle number" counter, tracking the number of the currently executing compression cycle, is incremented by one at step 118.

At step 120, the program checks to determine if the current cycle input buffer has any remaining input. If so, the program attempts, at step 122, to form a complete sequence. If the sequence is complete (step 124), a new compressed sequence code is formed, with removal code, at step 126, and a separator code added at step 128. The new compressed sequence code is stored in the next-cycle input buffer at step 130.

A check is made at step 132 to determine whether the predetermined maximum cycle number has been reached. If so, the first data supplied to the program has been compressed to the maximum degree for this particular program, and compression for this sequence terminates. The cycle number counter is reset to zero, and the program, returns to step 104 to acquire new input data from the zero cycle input buffer. The program continues to loop through the steps described above until no data remain in the input file. The program then passes to step 140.

At this point, the program executes in a corresponding manner to "empty the pipe," that is, to process all data in the various cycle input buffers, until no bits are available to form a sequence. The program then executes step 144 to store the remaining bits, in uncompressed form, at the end of the maximum cycle buffer. The contents of the maximum cycle buffer are then written to the designated output file. The program also writes the maximum cycle number to the front of the output file, and terminates at step 146.

Figure 5:
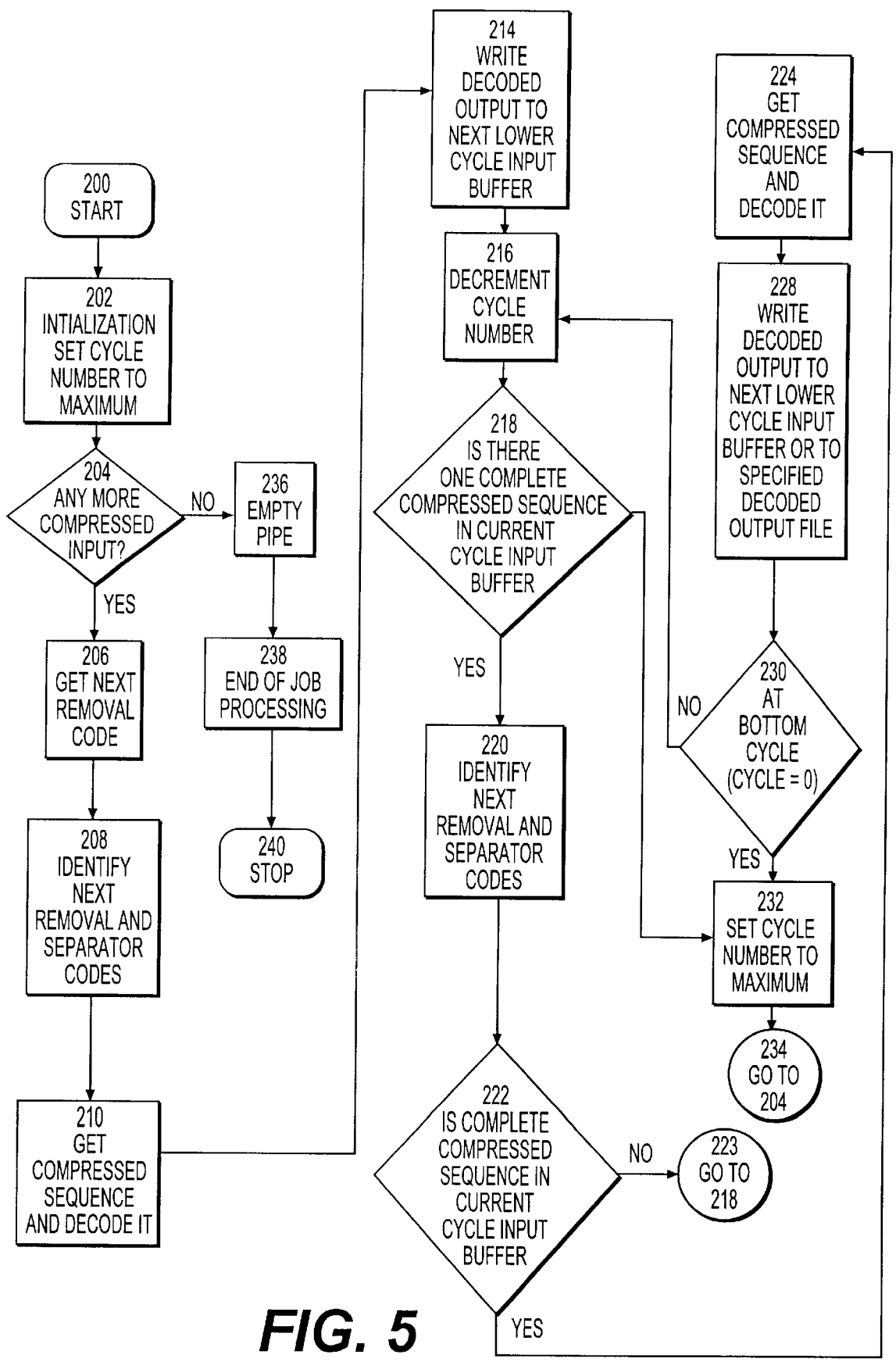
FIG. 5 is a logic flowchart of a method for decompressing the data produced by the method of FIG. 4.

Referring now to FIG. 5, a logic flowchart is shown of a method decompressing compressed digital data, which comprises a preferred embodiment of another aspect of the invention. The method is embodied in the form of a program for execution on a personal computer. At step 200, the program begins execution. During an initialization step, the program communicates with the user to determine specifications for the current run. This includes such information as the name of the compressed date file and the name of the decompressed output file (i.e., the restored source file). Alternatively, the name of the compressed file may be embedded in the compressed file itself. The program then proceeds to open the files specified by the user for compressed input and decoded output. After having opened the compressed input file, the program extracts from the front of this file the maximum cycle number reached during the encode run. It then uses this number to initialize a cycle counter at step 202. At this point we are at the bottom (i.e., lowest) cycle in an iteration. The program checks at step 204 to see if there are additional bytes of compressed input to be decoded. If so, the program proceeds to step 206 to obtain this compressed input and process it. If not, the program proceeds to step 236 to decompress the remaining data already input, to be described below, and conclude the current run.

At step 206, the program retrieves the next removal code.

At step 208, the next removal and separator codes are identified, as set forth in FIG. 2A. Then, at step 210, the decompressed sequence is obtained, using the removal code and any hanging bits.

At step 214, the decoded sequence is written into the next lower cycle's input buffer.

At step 216, the program decrements the cycle number by one, and processing for a new cycle begins. At step 218, the first step in processing a new cycle is to determine if one complete sequence is waiting to be processed in the current cycle input buffer. If so, the program retrieves this information and proceeds to step 220 for processing. If insufficient bits are available, the program proceeds to step 232. The program determines that it has a complete sequence by retrieving bits up to the start of the next removal code. This may include a separation code, which is discarded.

At step 220, the program identifies removal codes and separator codes in the current cycle exactly as in step 208. At step 222, the program determines in the same manner whether a complete compressed sequence is waiting in the current cycle input buffer. If so, the program proceeds to step 224. Otherwise, the program proceeds to step 223.

At step 224, the program obtains and decodes the next compressed sequence input bits in the same manner as at step 210. The decoded sequence is then written to the next lower cycle input buffer in the same manner as at step 214.

The program determines at step 230 whether the current cycle is cycle 0. If so, the end of decompression for this data has been reached, and the data sitting in the output buffer for this cycle is identical to the original source data. This is now written to the specified output file and the program proceeds to step 232. If the program is not at cycle 0, the program proceeds to step 216 and begins processing of the next cycle.

At step 232, the system resets the cycle number to the maximum cycle that was specified in the header information located at the start of the current compressed input file. This returns the program to the bottom of the pipe to continue processing as previously described, and the program returns by step 234. Step 204 determines if there is additional compressed input from the current file to be decoded.

If there is no more data at the input file, the program proceeds to "empty the pipe" and complete decompression of the data now contained in the various input buffers. When all input buffers are empty, the program proceeds to step 238. Various "housekeeping" tasks are performed at step 238 to set up for termination, and the decoding program terminates at step 240. The digital data contained in the specified output file is an exact replica of the original data input to the decoder.

The programs described in FIGS. 4 and 5 may be executed in an IBM-compatible personal computer having a 80486 processor running under MS-DOS operating system. Of course, a more powerful processor would achieve faster compression and decompression times.

Figure 6:
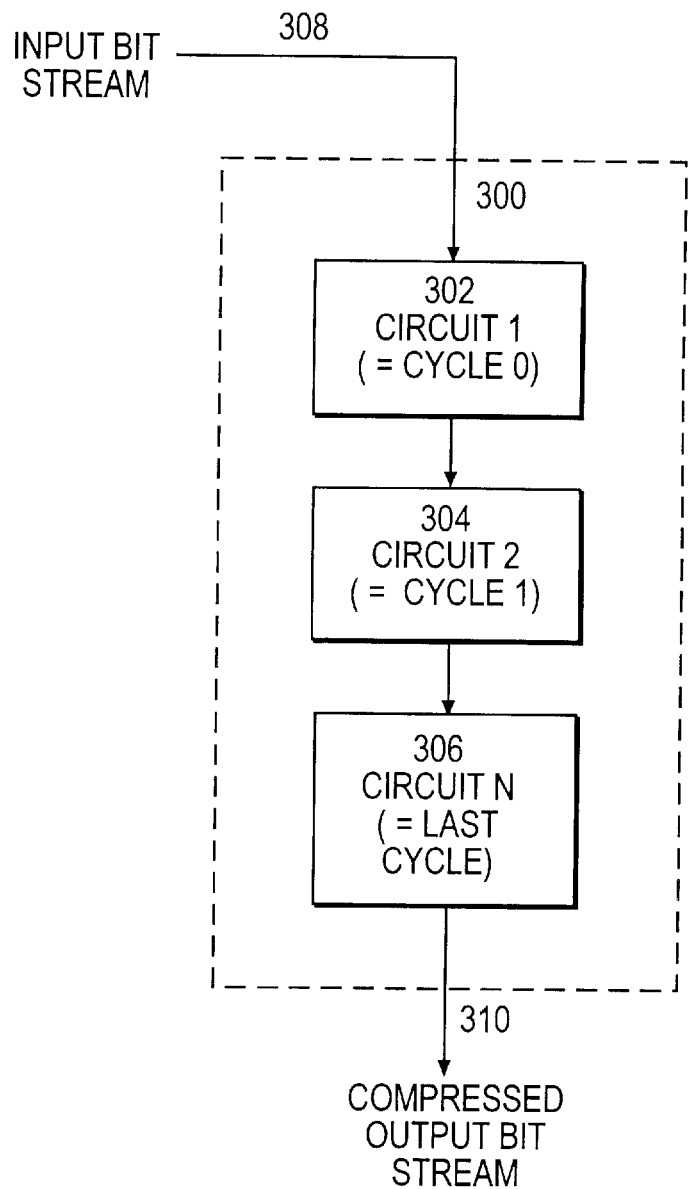
FIG. 6 is a VLSI custom-integrated circuit that performs lossless compression of digital data using the method shown in FIG. 3.

Referring now to FIG. 6, a preferred embodiment is shown of another aspect of the invention implemented in a VLSI custom integrated circuit ("IC") 300. The circuit 300 performs the encoding functions described in connection with the program of FIG. 3, using first, second, and third compression circuits. In particular, a first compression circuit 302 performs the functions for cycle 0 described in steps 106, 108, 110, 112, 114, and 116. Instead of writing the output to a "next cycle input buffer" as set forth in step 116, however, circuit 302 of IC 300 provides output to the input of the second circuit 304. A second compression circuit 304 performs the functions indicated in steps 122, 124, 126, 128, and 130. Instead of writing compressed output to a next cycle input buffer as set forth in step 130, however, circuit 304 provides its compressed output as input to the next circuit of the sequence contained in IC 300.

Different implementations of IC 300 may contain different numbers of circuits 302–306. Approximately seventy-five circuits are required for each power of 10 of the overall compression ratio. For example, seventy-five circuits in IC 300 will yield a compression ratio of approximately 10:1, one hundred and fifty circuits will yield a compression ratio of about 100:1, two hundred and twenty-five circuits will yield a compression ratio of approximately 1000:1, etc.

Third compression circuit 306 performs the functions of steps 122, 124, 126, 128, and 130. However, instead of writing data to an input buffer of the next cycle as set forth in step 130, circuit 306 provides an output signal consisting of a bit stream representing a compressed version of input supplied to circuit 302. Also, when circuit 306 determines that there are insufficient bits of additional data to form a sequence, the circuit supplies the remaining bits as an uncompressed "footer," terminating the output data stream.

Figure 7:
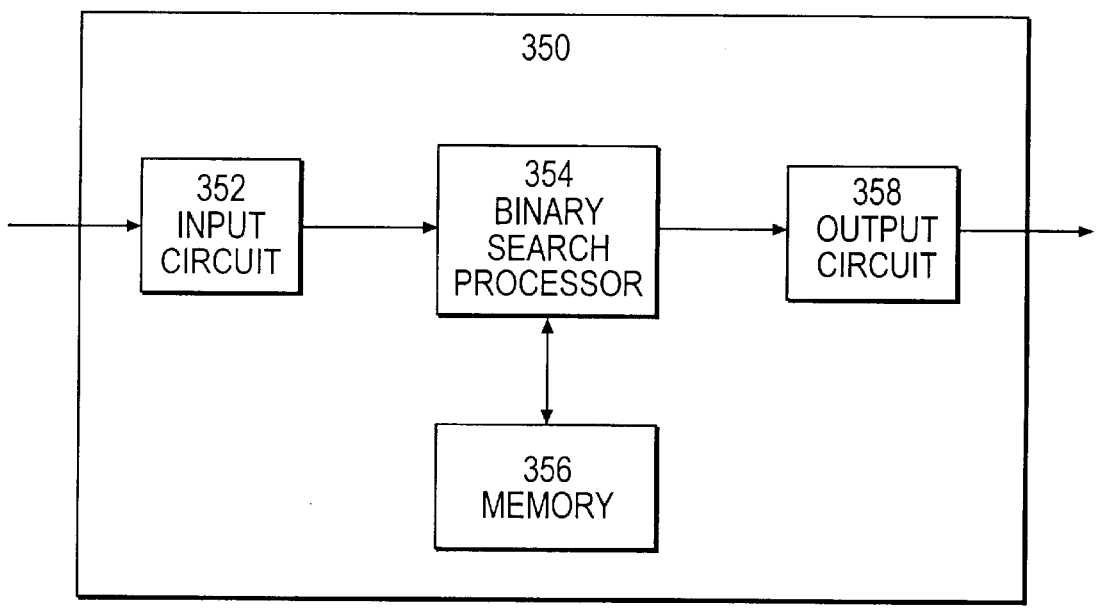
FIG. 7 is a block diagram of a common compression circuit that forms component circuits of the VLSI circuit of FIG. 5.

FIG. 7 is a block diagram of a common compression circuit 350 that forms circuits 302, 304, and 306. In the preferred embodiment, these circuits 302, 304, and 306 are identical, facilitating the implementation of a large number of such circuits in a VLSI chip.

Circuit 350 includes an input circuit 352 that receives data from either the input terminal 308 (for circuit 302) or the immediately preceding upstream compression circuit (for circuits 304 and 306). Input circuit 352 is coupled to a binary search processor 354 that performs digital data compression according to the method shown in FIG. 3. Temporary storage by processor 354 is performed by a memory circuit 356. Separator values are generated by processor 354 and supplied to an output circuit 358, which in turn, supplies these signals to either the output terminal 310 (circuit 306) or the input circuit of the immediate succeeding downstream compression circuit (circuits 302 and 304).

In another aspect of the present invention, a VLSI integrated circuit containing a plurality of identical decoding circuits performs the functions of the program of FIG. 5, in the manner similar to that discussed above with respect to the hardware version of the encoder, shown in FIG. 6.

It will be apparent to those skilled in the art that various modification and variations can be made in the method of the present invention and construction of the preferred embodiments, without departing from the scope or spirit of the invention. Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A method for compressing digital data, comprising the steps of:

(a) receiving digital data to be compressed;

(b) separating the digital data into groups having predetermined sequences of ones and zeros;

(c) processing a sequence according to a predetermined procedure to obtain a compressed sequence value of variable length by removing bits;

(d) storing the compressed sequence value in a temporary storage area;

(e) generating a removal code representative of the number of bits removed;

(f) generating a separator code according to predetermined criteria;

(g) storing the removal code and separator code in a predetermined relationship with the compressed sequence value in the temporary storage area;

(h) performing steps c through g for each of the groups to obtain an intermediate data set;

(i) separating the intermediate data set into sequences;

(j) repeatedly performing steps c through i a plurality of iterations according to predetermined criteria; and (k) supplying the intermediate data set of the final iteration as a compressed version of the received digital data.

2. A method as recited in claim 1, wherein the step of processing a sequence comprises obtaining a binary search code using a binary search procedure.

3. A method as recited in claim 1 wherein the step of generating a separator code comprises generating a separator code according to the characteristics of the compressed sequence value and the removal code.

4. A method as recited in claim 1 wherein the step of generating a removal code comprises generating a code having one fewer bits than the number of bits removed.

5. A method as recited in claim 1 wherein the step of generating a removal code comprises generating a code having a low-order zero and a plurality of higher order one-bits equal to two less than the number of bits removed from the sequence to form the compressed sequence value.

6. A method for decompressing compressed original digital data comprising the steps of:

(a) receiving input data comprising compressed original digital data including compressed data codes of various length separated by separator codes and removal codes and further including an iteration count;

(b) obtaining a data code from the input data using the separator value;

(c) processing the data code to obtain a decompressed value;

(d) temporarily storing the decompressed value;

(e) repeating steps (b), (c), and (d) until all input data has been processed;

(f) incrementing a counter;

(g) obtaining a data code from the temporarily stored decompressed values using a separator value;

(h) processing the data code to obtain a decompressed value;

(i) temporarily storing the decompressed value;

(j) repeating steps (f), (g), (h), and (i) until the counter equals the iteration count; and (k) outputting the stored decompressed values as a representation of the original digital data.

7. Apparatus for compressing digital data, comprising:

an input terminal receiving digital data to be compressed;

an output terminal supplying compressed digital data; and first, second, and third compression circuits, each of the compression circuits comprising:

an input circuit for received input data;

a processor circuit separating the received input data into sequences according to predetermined criteria;

a binary search processor for processing the sequences using a binary search procedure to obtain compressed sequence values corresponding to the sequences with lower order bits removed;

a code generator for generating removal codes representative of the number of bits removed and separator codes according to the characteristics of the compressed sequence values and removal codes; and an output circuit for supplying the compressed sequence values, removal codes, and separator codes as output data;

the input circuit of the first compression circuit being connected to the input terminal, the output circuit of the first compression circuit being connected to the input circuit of the second compression circuit, the output circuit of the second compression circuit being coupled to the input circuit of the third compression circuit, and the output circuit of the third compression circuit being connected to the output terminal.

8. Apparatus as recited in claim 7, also including a plurality of second compression circuits connected in series between the first and third compression circuits.

* * * * *